US011528017B1

(12) United States Patent
Goffman-Vinopal et al.

(10) Patent No.: US 11,528,017 B1
(45) Date of Patent: Dec. 13, 2022

(54) DIGITAL RING OSCILLATOR FOR MONITORING AGING OF SILICON DEVICES

(71) Applicant: Amazon Technologies, Inc., Seattle, WA (US)

(72) Inventors: Larisa Goffman-Vinopal, Zichron Yaakov (IL); Vladimir Kaplunov, Nahariya (IL)

(73) Assignee: Amazon Technologies, Inc., Seattle, WA (US)

( * ) Notice: Subject to any disclaimer, the term of this patent is extended or adjusted under 35 U.S.C. 154(b) by 5 days.

(21) Appl. No.: 17/004,715

(22) Filed: Aug. 27, 2020

(51) Int. Cl.
*H03K 3/03* (2006.01)
*H03K 3/0233* (2006.01)
*H03K 3/57* (2006.01)
*H03L 7/081* (2006.01)

(52) U.S. Cl.
CPC ....... *H03K 3/02335* (2013.01); *H03K 3/0315* (2013.01); *H03K 3/57* (2013.01); *H03L 7/0814* (2013.01)

(58) Field of Classification Search
None
See application file for complete search history.

(56) References Cited

U.S. PATENT DOCUMENTS 10,763,833 B2 * 9/2020 Muellner ............... H03K 3/014
2017/0269151 A1 * 9/2017 Favi .................. G01R 31/2856

* cited by examiner

*Primary Examiner* — Cassandra F Cox
(74) *Attorney, Agent, or Firm* — Kilpatrick Townsend & Stockton LLP (57) ABSTRACT

Methods and devices for determining integrated circuit (IC) device degradation over time are provided. Transistors are the basic building blocks of IC devices. The degradation of the transistors in IC devices over time leads slowly to decreased switching speeds. To monitor the condition of an IC device as it ages, oscillator circuitry operating at switching frequencies of various circuits in the IC device may be included and monitored for changes in switching frequency over time. A degraded condition of the IC device may be determined when the change in switching frequency exceeds a threshold value.

16 Claims, 6 Drawing Sheets

DIGITAL RING OSCILLATOR FOR MONITORING AGING OF SILICON DEVICES

BACKGROUND

Transistors are the basic building blocks of integrated circuit (IC) devices. IC devices can contain billions of transistors, sometimes operating at high clock speeds. The fast clock speeds mean that the transistors are exposed to high heat conditions, which can accelerate their deterioration. The degradation of the transistors in IC devices over time leads slowly to decreased switching speeds, and sometimes to circuit failures. Several different phenomena can degrade the transistors on IC devices, for example, hot-carrier injection, bias temperature instability, oxide breakdown, electromigration, etc. The manner in which these phenomena combine to diminish the functioning of an IC device depends on factors such as the circuit arrangement of the transistors, as well as the voltages and temperatures the transistors are exposed to. Further, transistors scaled down to smaller process dimensions may have tighter operating condition margins, which in turn can exacerbate how quickly the transistors fail. In view of the many variables, predicting the decline in the peak performance of IC devices over time can be difficult.

BRIEF DESCRIPTION OF THE DRAWINGS

Various embodiments in accordance with the present disclosure will be described with reference to the drawings, in which.

DETAILED DESCRIPTION

Integrated circuit (IC) devices can contain billions of transistors operating at high clock speeds, which can expose the transistors to high heat conditions. The high heat conditions can accelerate degradation of the transistors in an IC device over time, leading to decreased switching speeds and circuit failures. Phenomena such as hot-carrier injection, bias temperature instability, oxide breakdown, electromigration, etc., can degrade transistor performance, and their effects are influenced by factors such as the circuit arrangement of the transistors, as well as transistor voltages and temperatures.

In order to determine the manner in which the various phenomena affect IC devices over time, accelerated life testing may be performed on IC devices. Accelerated life testing subjects an IC device to conditions (e.g., temperatures, voltages) in excess of its normal operational parameters in an effort to uncover faults and potential modes of failure in a short amount of time. By analyzing the response of an IC device to accelerated life testing, predictions may be made about the service life of the IC device.

The service life predictions can be used to implement guard bands that define acceptable IC device performance, thereby reducing yield loss. For example, an IC device can be capable of operating at a clock frequency of 1.2 GHz when initially fabricated. As the IC device ages, the operating frequency may decrease down to 1 GHz due to transistor degradation. A guard band can be implemented to rate the IC device for operation at 1 GHz, such that the IC device can still operate at the rated frequency after the IC device has gone through a period of degradation.

Due to the complex nature of IC devices containing billions of transistors performing complex circuit functions, it may be difficult to collect meaningful data from the operational circuitry of the IC device. Therefore, dedicated test structures may be incorporated into the IC device to enable acquisition of the test data.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

According to some aspects of the present disclosure, a Digital Ring Oscillator (DRO) may be used as a dedicated test structure to measure the effects of accelerated life testing on the components (e.g., transistors) of an IC device. A DRO is an oscillator composed of a set of functional stages, for example, an odd number of inverting devices, such as NAND gates, NOR gates, inverters, or combinations thereof. Other functional stages configured to generate an oscillation frequency may be used without departing from the scope of the present disclosure. A DRO may be configured such that the output of each device is fed to the input of the subsequent device, and the output of the last device in the structure is fed back to the input of the first device. The odd number of devices provides an output that oscillates between two voltage levels. The oscillation frequency of the DRO may be related to several factors, for example, power supply voltage, number of stages, propagation delay of each stage, etc.

Figure 1:
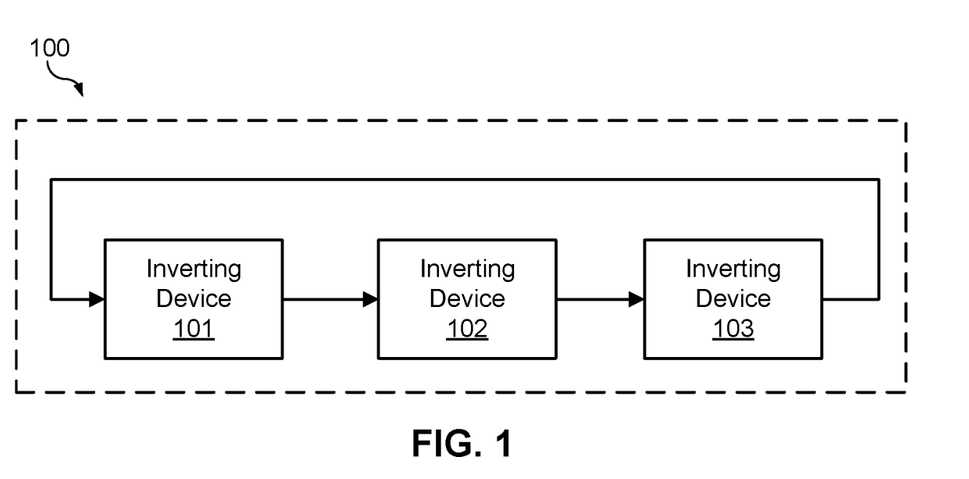
FIG. 1 is a block diagram illustrating a general configuration of an example of a digital ring oscillator (DRO) according to some aspects of the present disclosure.

FIG. 1 is a block diagram illustrating general configuration of an example of a DRO 100 according to some aspects of the present disclosure. As illustrated in FIG. 1, the DRO 100 may include a first inverting device 110, a second inverting device 120, and a third inverting device 130. Other DRO configurations may include other odd numbers of inverting devices. The inverting devices may be digital devices such as logic gates.

An inverting device produces an output that is an inverted state of a value on its input. For example, when a logic "1"

is input to the inverting device, a logic "0" will be generated as an output. Similarly, when a logic "0" is input to the inverting device, a logic "1" will be generated as an output. The changes of output values of the inverting devices are generated based on switching of the transistors that make up the inverting devices from "on" states to "off" states in accordance with the designed operation of the particular inverting devices.

Referring to FIG. 1, when a logic "0" appears at the input of the first inverting device 101, a logic "1" will be generated at the output of the first inverting device 101 and will appear as a logic "1" at the input of the second inverting device 102. The logic "1" at the input of the second inverting device 102 will generate a logic "0" at the output of the second inverting device 102. The logic "0" generated at the output of the second inverting device 102 and will appear as a logic "0" at the input of the third inverting device 103, and will cause a logic "1" to be generated at the output of the third inverting device 103. The output of the third inverting device 103 is fed back to the input of the first inverting device 101 causing the input to the first inverting device 101 to change from a logic "0" to a logic "1." The first inverting device 101 inverts the input value causing its output to switch from a logic "1" to a logic "0," and so on through the inverting devices.

The changes in state of the inputs and outputs of the logic devices continues to ripple through all of the inverting devices producing the oscillation of the DRO. The frequency of the oscillations may be related to the switching frequency of the IC device. For example, the oscillation frequency may be equal to the switching frequency of the IC device, or may be equal to a fraction (e.g., one-half or another fraction) of the switching frequency of the IC device. The DRO can be configured to have a certain oscillation frequency, for example, by designing each inverter stage to have certain propagation delay, varying the number of inverting stages, varying the supply voltage of the DRO, etc.

Figure 2:
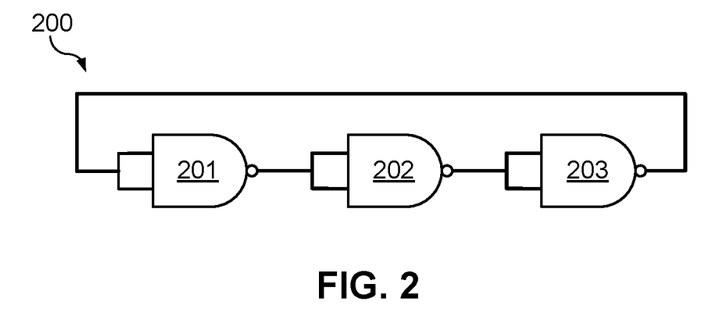
FIG. 2 is a schematic diagram illustrating a configuration of a DRO using NAND gates according to some aspects of the present disclosure.

FIG. 2 illustrates an example of a DRO 200 configured with NAND gates. With the inputs of the NAND gates connected together as shown in FIG. 2, each NAND gate inverts the value appearing at its input. Thus, when a logic "0" appears at the input of the first NAND gate 201, it generates a logic "1" at its output which is input to the second NAND gate 202. The second NAND gate 202 generates a logic "0" at its output which is input to the third NAND gate 203. The third NAND gate 203 generates a logic "1" at its output which is fed back to the input of the first NAND gate 201 to sustain the oscillation.

Figure 3:
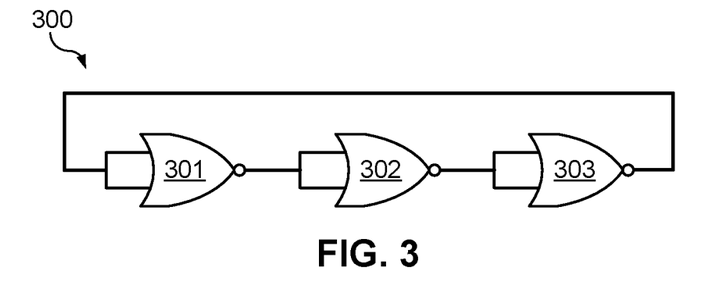
FIG. 3 is a schematic diagram illustrating a configuration of a DRO using NOR gates according to some aspects of the present disclosure.

FIG. 3 illustrates an example of a DRO 300 configured with NOR gates. With the inputs of the NOR gates connected together as shown in FIG. 3, each NOR gate inverts the value appearing at its input. Thus, when a logic "0" appears at the input of the first NOR gate 301, it generates a logic "1" at its output which is input to the second NOR gate 302. The second NOR gate 302 generates a logic "0" at its output which is input to the third NOR gate 303. The third NOR gate 303 generates a logic "1" at its output which is fed back to the input of the first NOR gate 301 to sustain the oscillation.

Figure 4:
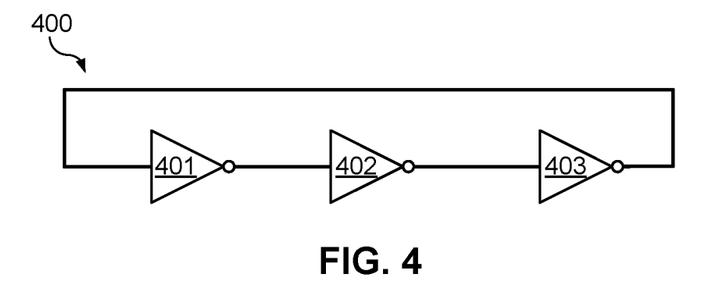
FIG. 4 is a schematic diagram illustrating a configuration of a DRO using inverters according to some aspects of the present disclosure.

FIG. 4 illustrates an example of a DRO 400 configured with inverters. An inverter has one input and generates an output that is an inverted state of a value on its input. A logic "0" appearing on the input of the first inverter 401 generates a logic "1" that is input to the second inverter 402 which generates a logic "0" output that is input to the third inverter 403 which generates a logic "1" output. The logic "1" output of the third inverter 403 is fed back to the input of the first inverter 401 to sustain the oscillation.

Figure 5:
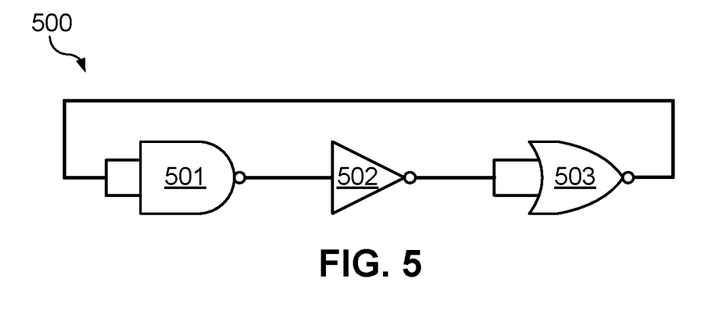
FIG. 5 is a schematic diagram illustrating a configuration of a DRO using a combination of NAND gates, inverters, and NOR gates according to some aspects of the present disclosure.

FIG. 5 illustrates an example of DRO 500 configured with a combination of a NAND gate 501, an inverter 502, and a NOR gate 503. As explained above, each of the NAND gate 501, the inverter 502, and the NOR gate 503 will generate an output that that is an inverted state of a value on its input. By feeding back the output of the last device (NOR gate 503) to the input of the first device (NAND gate 501), the oscillation of the DRO 500 will be sustained. While FIG. 5 illustrates a particular configuration of a combination of devices, other combinations of logic gates may be used without departing from the scope of the present disclosure. While examples of DROs have been described for generating oscillation frequencies related to the switching frequencies of an IC device, other circuits capable of generating frequencies related to the switching frequency of an IC device may be used without departing from the scope of the present disclosure.

Integrated circuit devices may be fabricated with transistors having different characteristics, such as threshold voltage ($V_t$), and different geometries, such as transistor length and width. Different transistor characteristics and geometries can affect the failure mechanisms (e.g., hot carrier injection (HCI), negative bias temperature instability (NBTI), etc.) and failure modes of the transistors. Transistor fabrication process technologies can also determine threshold voltages, for example, standard threshold voltage (SVT) (e.g., 350 millivolts (mV)-500 mV), low threshold voltage (LVT) (e.g., 200 mV-350 mV), and ultra-low threshold voltage (ULVT) (e.g., lower than 200 mV). Transistors fabricated with smaller feature sizes may have lower threshold voltages. An integrated circuit device may include transistors fabricated with any combination of characteristics and geometries.

According to aspects of the present disclosure, DROs used for monitoring electronic device aging can monitor device performance degradation as result of accumulated aging effects during both accelerated aging experiments and actual operation life of the electronic device. Due to the high temperature and voltage stresses placed on in IC device during accelerated life testing, some of the circuitry in the IC device may experience difficulty running at the switching frequency for which the IC device was designed.

Some failure mechanisms such as HCI, however, are frequency dependent and may not be activated or may have an insignificant effect at low frequencies. In some implementations, the DROs for monitoring device aging, may be designed to operate at a selectable frequency, for example, a switching frequency of the IC device or a frequency equal to a maximum data rate of the IC device's capability. In some implementations, the DROs may be designed to operate at the switching frequency of the IC device or at a sub-multiple (e.g., one-half or another fraction) of the switching frequency of the IC device. During accelerated life testing, the DROs may operate at a higher frequency than other portions of the IC device circuitry.

For an IC device, one or more DROs may be fabricated as part of the circuitry. The DROs may be fabricated according to the process parameters used to fabricate various circuit portions the IC device. DROs having different transistor geometries (e.g., gate lengths) and/or threshold voltages (e.g., standard $V_t$ (SVT), low $V_t$ (LVT), ultralow $V_t$ (ULVT), etc.) may be fabricated as part of the IC device circuitry. For example, DROs having gate lengths of 8 nanometer (nm) and 11 nm may be fabricated using each of SVT, LVT, and ULVT process parameters (e.g., gate oxide thickness, doping levels, etc.), for a total of six DROs fabricated on the IC device. Other or additional process parameters and transistor geometries can be varied to fabricate more or fewer DROs on an IC device without departing from the scope of the present disclosure.

Figure 6:
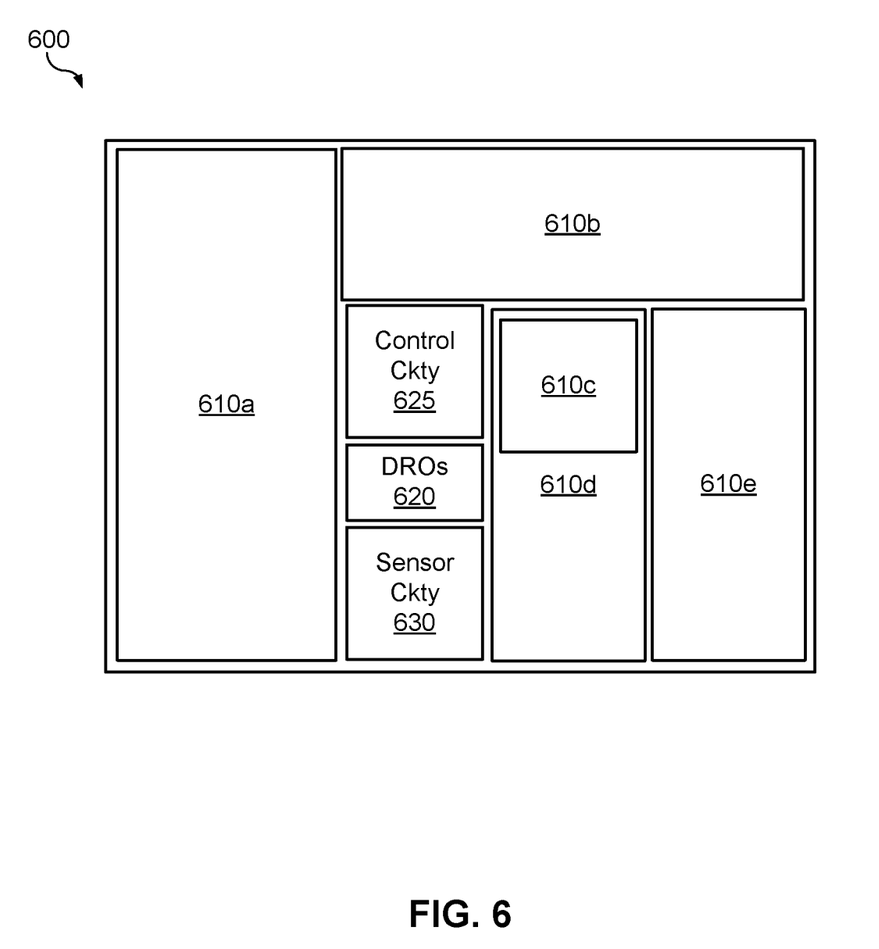
FIG. 6 is a diagram illustrating an example of an integrated circuit device including a digital ring oscillator according to some aspects of the present disclosure.

FIG. 6 is a diagram illustrating an example of an integrated circuit device 600 including a digital ring oscillator 620 according to some aspects of the present disclosure. Referring to FIG. 6, the IC device 600 may have various circuit portions 610a-610e that perform different functions, for example, memory, processors, logic functions, communication functions, input/output (I/O) functions, etc., as well as one or more DROs 620 and sensor circuitry 630. The various circuit portions 610a-610e may further include control circuitry 625 configured to receive instructions (e.g., software instructions or electrical signals) for enabling and disabling the DROs 620. In some implementations, the instructions may cause the DROs 620 to operate whenever the processor is running. In other implementations, the instructions may cause the DROs 620 to operate whenever a circuit of interest other than the processor is running. Some circuit portions may be fabricated using different process parameters and/or geometries than other circuit portions. The DROs 620 may include one or more DROs fabricated according to the process parameters and geometries used to fabricate the other circuit portions 610a-610e.

The DROs 620 may be designed to oscillate (e.g., switch or toggle) at a specified frequency, for example, the maximum clock frequency of the IC device, a sub-multiple of the clock frequency of the IC device (e.g., one-half the maximum clock frequency (Fmax/2)), or another switching frequency at which the IC device operates (e.g., a switching frequency of a logic circuit, data pipeline, etc.). By operating at these frequencies consistent with the designed switching frequencies of the IC device, more accurate information regarding the aging effects of the transition devices may be obtained. The DROs may be placed in the IC device in proximity to a thermal diode or other thermal sensor for accurate measurement of the operating temperature of the DROs, during accelerated life testing and/or during actual operation in the field.

Sensor circuitry 630 incorporated into the IC device may include various sensors (e.g., voltage sensors, temperature sensors, frequency sensors, etc.) and may measure operational parameters of the DROs. For example, temperature, voltage levels, oscillation frequency data, oscillation frequency shift data (e.g., a decrease in oscillation frequency), as well as other data, may be collected for the DROs by the sensor circuitry 630 and transmitted to an external system (not shown). Changes in the oscillation frequency of the DROs may be determined by the external circuitry. The collected data may be used for prediction of performance degradation over the device life time.

The DROs may be configured to be operationally isolated from other portions of the circuit during scan testing as part of accelerated life testing. During accelerated life testing, normal operation of the IC device may be interrupted, and known test patterns may be shifted in and out of the logic circuitry to determine whether the circuitry is operating properly. In the "isolated" mode, the DROs may continue to operate while other portions of the circuitry are tested.

In some implementations, operation of the DROs may be enabled whenever a processor or another circuit of interest of the IC device is running or operating (e.g., executing processor instructions, etc.). In some implementations, individual DROs may be activated when corresponding portions of the IC device circuitry are activated. For example, a DRO may be activated when a processor is running, another DRO may be activated when a data pipeline is activated, etc. In such cases, the DROs may operate at a same switching frequency as the corresponding circuit portion. In some implementations, the DROs may be configured to be enabled and disabled by instructions (e.g., a software instruction or electrical signal) provided to the IC device by test equipment or another external device. For example, an instruction provided to the IC device to enable the DROs may cause the DROs to operate, e.g., switch or toggle, at the specified frequency, until a subsequent instruction is provided to disable the operation of the DROs or until the IC device is reset (e.g., returned to an initial state). Therefore, the DROs may be enabled to operate periodically during the accelerated life tests or may be enabled to operate for the entire duration of the accelerated life test.

Sensor circuitry incorporated into the IC device may measure and store data related to the oscillation frequency of the DROs. In such implementations, the data may be downloaded or transmitted from the IC device after completion of the testing. In some implementations, the data related to the DRO oscillation frequency may be measured and collected by circuitry external to the IC device (e.g., test equipment). In still other implementations, data related to the oscillation frequency of the DROs may be measured by sensor circuitry incorporated into the IC device, and the measurements can be transmitted to external devices for storage and/or processing.

Degradation of the transistors in the IC device can cause changes in the oscillation frequency of the DROs. Changes in the oscillation frequency may be measured directly, for example, via a frequency counter or other direct methods, or by indirect methods such as determining a beat frequency or other indirect methods. The IC device may be considered as having reduced functionality or being no longer functional if the oscillation frequency drops below a threshold oscillation frequency. For example, a threshold may be set at a 10% decrease, or another value, in oscillation frequency of the DROs for the IC device to be considered having reduced functionality or no longer functional.

By determining changes in DRO oscillation frequency, predictions can be made about the service life of the IC device. Changes in DRO oscillation frequency may be determined by testing the operation of the IC device, including measuring the DRO oscillation frequency, at nominal operating conditions (e.g., within the acceptable limits of the IC device), subjecting the IC device to the elevated accelerated life test conditions (e.g., elevated temperature, elevated voltage levels, etc.), and then retesting the IC device at nominal operating conditions to determine any differences in DRO oscillation frequency. Since the oscillation frequency is dependent at least in part on the threshold voltage of the transistors, the changes in DRO oscillation frequency also provide an indirect measure of degradation of transistor threshold voltages.

The service life predictions can be used to implement guard bands that define acceptable IC device performance. For example, an IC device may operate at a high switching frequency when initially fabricated, but its switching frequency may decrease due to transistor degradation as the IC device ages. A guard band may be used to rate the switching frequency of the IC device to be below what the IC device is capable of such that the IC device can still provide acceptable performance after a period of aging, thereby reducing yield loss.

According to some aspects of the present disclosure, frequency data from the DROs may also be used when an IC device is installed in a higher level device operating in the field (e.g., a line card or processor being installed in a server or other computing device). In some implementations, the higher level device in which the IC device is installed may include monitoring circuitry that monitors the oscillation frequency of the DROs. In some implementations, the IC device may transmit DRO oscillation frequency data to an external system that monitors operation of the higher level device in which the IC device is installed. For example, the IC device may report the DRO frequency data to a server in which it is installed, and the server may transmit the DRO frequency data to monitoring equipment.

The monitoring equipment may store the DRO frequency data and determine changes in the oscillation frequency of the DRO. Changes in the DRO oscillation frequency exceeding a threshold value, for example, a decrease in oscillation frequency of 10% or another value, may indicate that the IC device is nearing the end of its service life. The monitoring equipment may provide a notification that the IC device has reached its service lifetime, and indicate to the higher-level device (e.g., the server) that the IC device may need replacement.

Figure 7:
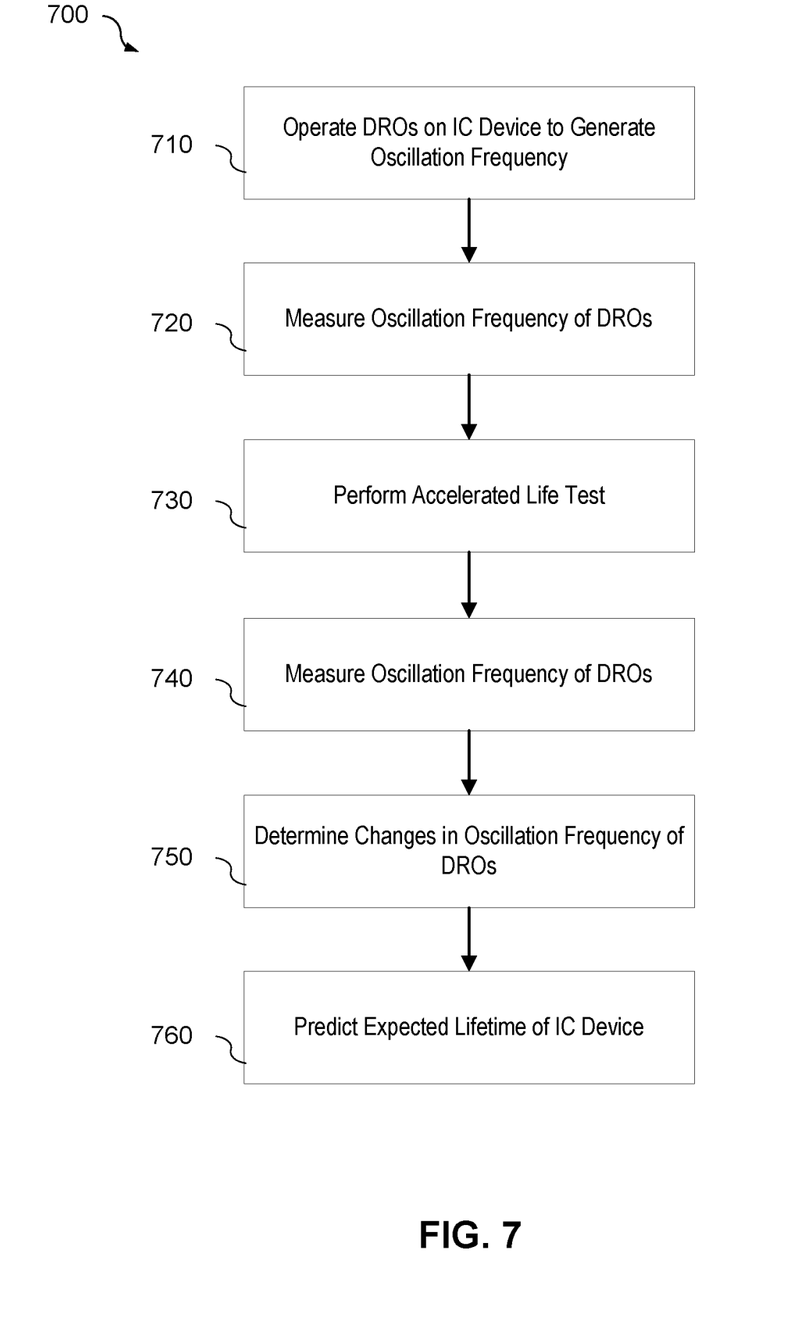
FIG. 7 is a flowchart illustrating a method for predicting an expected service life of an IC device according to some aspects of the present disclosure.

FIG. 7 is a flowchart illustrating a method 700 for predicting an expected service life of an IC device according to some aspects of the present disclosure. Referring to FIG. 7, at block 710, the DROs may be operated on the IC device to generate an oscillation frequency. One or more DROs may be incorporated into the IC. The one or more DROs may be used as dedicated test structures to measure the effects of accelerated life testing on the components (e.g., transistors) of an IC device. The DROs may be fabricated according to the process parameters used to fabricate various circuit portions of the IC device. For example, DROs having different transistor geometries and/or threshold voltages (e.g., SVT, LVT, ULVT) may be fabricated as part of the IC device circuitry. The frequency of oscillation of the DROs may be related to the switching frequency of the IC device. For example, the oscillation frequency may be equal to the switching frequency of the IC device, or may be equal to a fraction (e.g., one-half or another fraction) of the switching frequency of the IC device. In some implementations, individual DROs may be activated when corresponding portions of the IC device circuitry are activated. For example, a DRO may be activated when a processor is running, another DRO may be activated when a data pipeline is activated, etc. In such cases, the DROs may operate at a same switching frequency as the corresponding circuit portion.

At block 720, the oscillation frequency of the DROs may be measured. The DROs 220 may be designed to oscillate (e.g., switch or toggle) at a specified frequency, for example, the maximum clock frequency of the IC device, one-half the maximum clock frequency (Fmax/2), or another switching frequency that is based on a switching frequency of the IC device (e.g., a switching frequency of a logic circuit, data pipeline, etc.). Sensor circuitry incorporated into the IC device may measure and store data related to the oscillation frequency of the DROs. For example, the data may include, the measured oscillation frequency, a change in oscillation frequency over time, etc. In such implementations, the data may be downloaded from the IC device after completion of the testing. In some implementations, the data related to the DRO oscillation frequency may be measured and collected by circuitry external to the IC device (e.g., test equipment). In still other implementations, data related to the oscillation frequency of operation of the DROs may be measured by sensor circuitry incorporated into the IC device and transmitted to external devices for storage and/or processing.

At block 730, accelerated life testing may be performed on the IC device. The IC device may be subjected to elevated conditions, for example elevated temperature and elevated voltage levels, for a specified period of time. During the accelerated life test, the circuitry of the IC device may operate at a lower frequency than the switching frequency for which the IC device was designed. The DROs, however, may operate at a higher frequency, for example, the maximum switching frequency of the IC device or a sub-multiple (e.g., one half the maximum switching frequency) of the IC device.

At block 740, the IC device may be retested at nominal operating conditions. The IC device may be returned to nominal temperature and voltage levels (e.g., within the acceptable limits of the IC device) and the oscillation frequency of the DROs may be measured again.

At block 750, changes in the oscillation frequency of the DROs may be determined. Operational parameters, such as oscillation frequency, of the DROs may be measured by sensor circuitry incorporated into the integrated circuit device or by external test equipment. Changes in the oscillation frequency may be measured directly, for example, via a frequency counter or other direct methods, or by indirect methods such as determining a beat frequency or other indirect methods.

For example, oscillation frequency data, oscillation frequency shift data (e.g., a decrease in oscillation frequency), as well as other data, may be collected for the DROs by the sensor circuitry. In some implementations, the sensor circuitry may measure and transmit the DRO oscillation frequency to an external system, and changes in the oscillation frequency of the DROs may be determined by the external circuitry. In some implementations, the sensor circuitry may determine changes in the oscillation frequency of the DROs and transmit the changes to an external system.

At block 760, an expected lifetime of the IC device may be predicted based on the changes in oscillation frequency of the DROs. Degradation of the transistors in the IC device can cause changes in the oscillation frequency of the DROs. For example, changes in the oscillation frequency may be measured directly, for example, via a frequency counter or other direct methods, or by indirect methods such as determining a beat frequency or other indirect methods.

A threshold oscillation frequency may be determined below which the IC device may be considered to be no longer functional. For example, a threshold may be set at a 10% decrease, or another value, in oscillation frequency of the DROs.

The specific steps illustrated in FIG. 7 provide a particular method for monitoring the service life of an IC device according to an embodiment of the present disclosure. Other sequences of steps may also be performed according to alternative embodiments. For example, alternative embodiments may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications.

Figure 8:
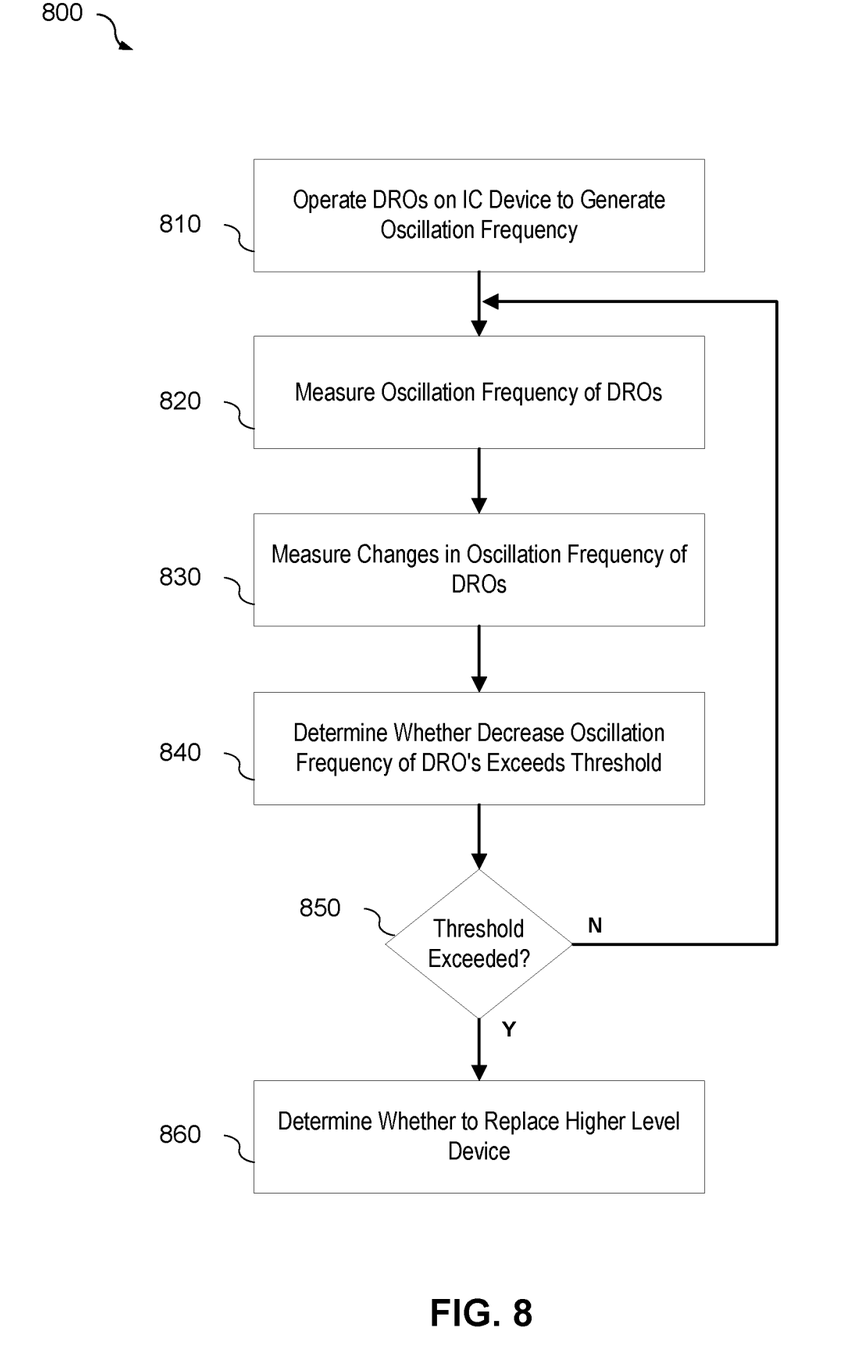
FIG. 8 is a flowchart illustrating a method for monitoring the performance of an IC operating in a device according to some aspects of the present disclosure.

FIG. 8 is a flowchart illustrating a method 800 for monitoring the performance of an IC device operating in a higher level device according to some aspects of the present disclosure. Referring to FIG. 8, at block 810, the DROs may be operated on the IC device to generate an oscillation frequency. One or more DROs may be incorporated into the IC device. The one or more DROs may be used as dedicated structures to measure the degradation of the components (e.g., transistors) of an IC device. The DROs may be fabricated according to the process parameters used to fabricate various circuit portions of the IC device. For example, DROs having different transistor geometries and/or threshold voltages (e.g., SVT, LVT, ULVT) may be fabricated as part of the IC device circuitry. The frequency of oscillation of the DROs may be related to the switching frequency of the IC device. For example, the oscillation frequency may be equal to the switching frequency of the IC device, or may be equal to a fraction (e.g., one-half or another fraction) of the switching frequency of the IC device. In some implementations, individual DROs may be activated when corresponding portions of the IC device circuitry are activated. For example, a DRO may be activated when a processor is running, another DRO may be activated when a data pipeline is activated, etc. In such cases, the DROs may operate at a same switching frequency as the corresponding circuit portion.

At block 820, the oscillation frequency of the DROs may be measured. The DROs 220 may be designed to oscillate (e.g., switch or toggle) at a specified frequency, for example, at the maximum clock frequency of the IC device, one-half the maximum clock frequency (Fmax/2), or another switching frequency based on the frequency at which the IC device operates (e.g., a switching frequency of a logic circuit, data pipeline, etc.). Sensor circuitry incorporated into the IC may measure and store data related to the oscillation frequency of the DROs. In such implementations, the data may be downloaded periodically from the IC device. In some implementations, the data related to the DRO oscillation frequency may be measured and collected by circuitry external to the IC device (e.g., test equipment). In still other implementations, data related to the oscillation frequency of operation of the DROs may be measured by sensor circuitry incorporated into the IC device and transmitted to an external device for storage and/or processing.

At block 830, changes in the oscillation frequency of the DROs may be determined. Operational parameters, such as oscillation frequency, of the DROs may be measured by sensor circuitry incorporated into the integrated circuit device or by external circuitry. Changes in the oscillation frequency may be measured directly, for example, via a frequency counter or other direct methods, or by indirect methods such as determining a beat frequency or other indirect methods.

For example, oscillation frequency data, oscillation frequency shift data (e.g., a decrease in oscillation frequency), as well as other data, may be collected on the DROs by the sensor circuitry. In some implementations, the sensor circuitry may measure and transmit the DRO oscillation frequency to an external system, and changes in the oscillation frequency of the DROs may be determined by the external circuitry. In some implementations, the sensor circuitry may determine changes in the oscillation frequency of the DROs and transmit the changes to an external system.

At block 840, it may be determined whether a decrease in oscillation frequency of the IC device exceeds a threshold. Degradation of the IC device due to aging can cause changes in the oscillation frequency of the DROs. Changes in the oscillation frequency may be measured directly, for example, via a frequency counter or other direct methods, or by indirect methods such as determining a beat frequency or other indirect methods. The IC device may be considered to be no longer functional if the DRO oscillation frequency drops below a threshold. For example, a threshold may be set at a 10% decrease in the oscillation frequency of the DROs, or at some other value or percentage.

At block 850, in response to determining that the decrease in oscillation frequency of the DROs has not exceeded the threshold (850—N), the method may continue at block 820 to measure the oscillation frequency of the DROs at a later time.

In response to determining that the decrease in oscillation frequency of the DROs has exceeded the threshold (850—Y), at block 860, it may be that the higher-level device incorporating the IC device should be replaced. The reduced switching frequency of the DRO can provide an indication that the higher-level device may no longer be performing according to the higher-level device's performance requirements.

The specific steps illustrated in FIG. 8 provide a particular method for monitoring the service life of an IC device according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications.

The methods 700 and 800, respectively, may be embodied on a non-transitory computer readable medium, for example, a memory or other non-transitory computer readable medium known to those of skill in the art, having stored therein a program including computer executable instructions for making a processor, computer, or other programmable device execute the operations of the methods.

Some or all of the methods 700 and 800 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Figure 9:
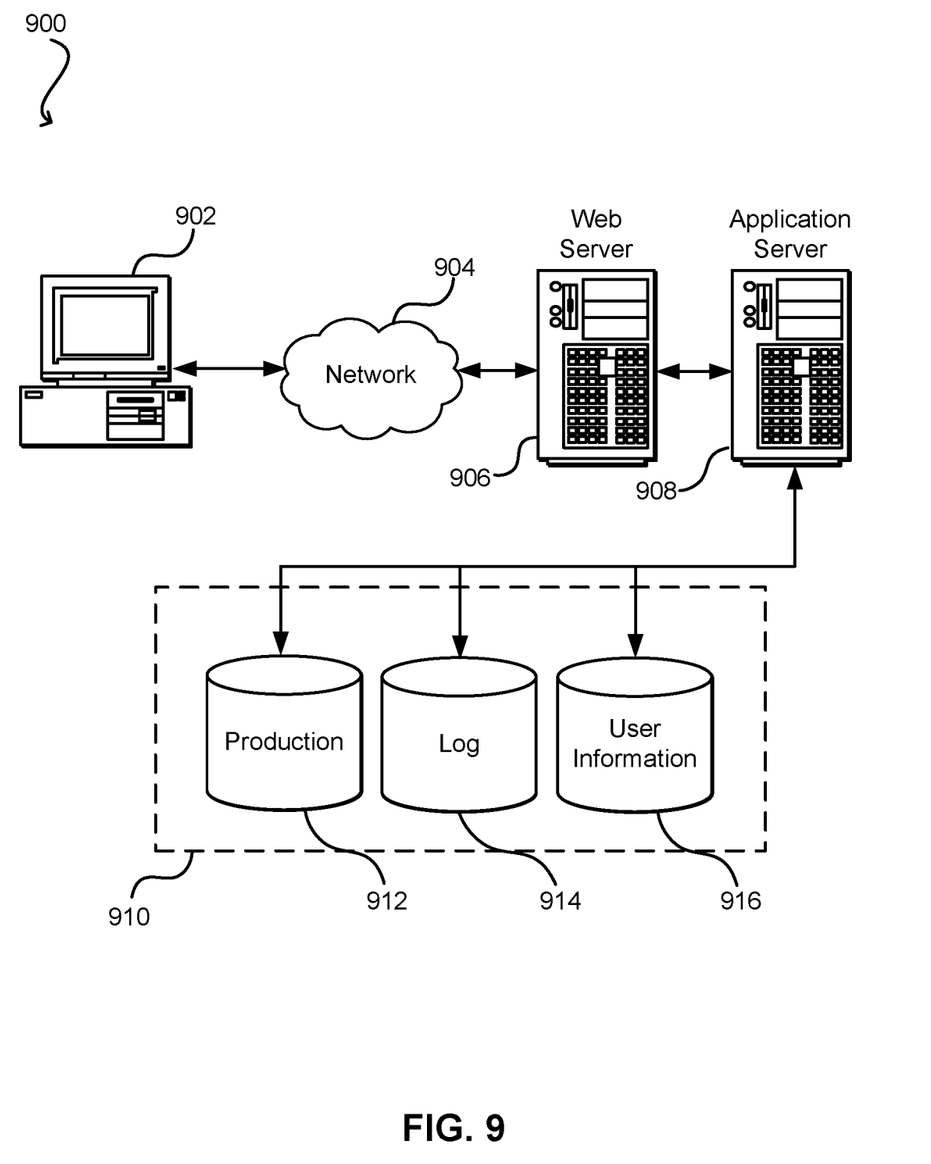
FIG. 9 illustrates an environment in which various embodiments can be implemented.

FIG. 9 illustrates an example environment 900 for implementing aspects of the present disclosure in accordance with various embodiments. As will be appreciated, although a Web-based environment is used for purposes of explanation, different environments may be used, as appropriate, to implement various embodiments. The environment includes an electronic client device 902, which can include any appropriate device operable to send and receive requests, messages, or information over an appropriate network 904 and convey information back to a user of the device. Examples of such client devices include personal computers, cell phones, handheld messaging devices, laptop computers, set-top boxes, personal data assistants, electronic book readers, and the like. The client device 902 may include test equipment or monitoring circuitry configured to determine the oscillation frequency or changes in the oscillation frequency of the DROs. The network can include any appropriate network, including an intranet, the Internet, a cellular network, a local area network, or any other such network or combination thereof. Components used for such a system can depend at least in part upon the type of network and/or environment selected. Protocols and components for communicating via such a network are well known and will not be discussed herein in detail. Communication over the network can be enabled by wired or wireless connections and combinations thereof. In this example, the network includes the Internet, as the environment includes a Web server 906 for receiving requests and serving content in response thereto, although for other networks an alternative device serving a similar purpose could be used as would be apparent to one of ordinary skill in the art.

The illustrative environment includes at least one application server 908 and a data store 910. It should be understood that there can be several application servers, layers, or other elements, processes, or components, which may be chained or otherwise configured, which can interact to perform tasks such as obtaining data from an appropriate data store. As used herein the term "data store" refers to any device or combination of devices capable of storing, accessing, and retrieving data, which may include any combination and number of data servers, databases, data storage devices, and data storage media, in any standard, distributed, or clustered environment. The application server can include any appropriate hardware and software for integrating with the data store as needed to execute aspects of one or more applications for the client device, handling a majority of the data access and business logic for an application. The application server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. The handling of all requests and responses, as well as the delivery of content between the client device 902 and the application server 908, can be handled by the Web server. It should be understood that the Web and application servers are not required and are merely example components, as structured code discussed herein can be executed on any appropriate device or host machine as discussed elsewhere herein.

The data store 910 can include several separate data tables, databases or other data storage mechanisms and media for storing data relating to a particular aspect. For example, the data store illustrated includes mechanisms for storing production data 912 and user information 916, which can be used to serve content for the production side. The data store also is shown to include a mechanism for storing log data 914, which can be used for reporting, analysis, or other such purposes. It should be understood that there can be many other aspects that may need to be stored in the data store, such as for page image information and to access right information, which can be stored in any of the above listed mechanisms as appropriate or in additional mechanisms in the data store 910. The data store 910 is operable, through logic associated therewith, to receive instructions from the application server 908 and obtain, update or otherwise process data in response thereto. In one example, a user might submit a search request for a certain type of item. In this case, the data store might access the user information to verify the identity of the user and can access the catalog detail information to obtain information about items of that type. The information then can be returned to the user, such as in a results listing on a Web page that the user is able to view via a browser on the user device 902. Information for a particular item of interest can be viewed in a dedicated page or window of the browser.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

The environment in one embodiment is a distributed computing environment utilizing several computer systems and components that are interconnected via communication links, using one or more computer networks or direct connections. However, it will be appreciated by those of ordinary skill in the art that such a system could operate equally well in a system having fewer or a greater number of components than are illustrated in FIG. 9. Thus, the depiction of the system in FIG. 9 should be taken as being illustrative in nature and not limiting to the scope of the disclosure.

The various embodiments further can be implemented in a wide variety of operating environments, which in some cases can include one or more user computers, computing devices or processing devices which can be used to operate any of a number of applications. User or client devices can include any of a number of general purpose personal computers, such as desktop or laptop computers running a standard operating system, as well as cellular, wireless, and handheld devices running mobile software and capable of supporting a number of networking and messaging protocols. Such a system also can include a number of workstations running any of a variety of commercially-available operating systems and other known applications for purposes such as development and database management. These devices also can include other electronic devices, such as dummy terminals, thin-clients, gaming systems, and other devices capable of communicating via a network.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Such devices also can include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit (IC) device, comprising:
 ring oscillator circuitry comprising:
  a ring oscillator having an odd number of series-connected inverting stages fabricated as part of the IC device, the ring oscillator configured to generate an oscillation frequency equal to a switching frequency of the IC device;

control circuitry configured to receive an instruction for causing the ring oscillator to generate the oscillation frequency whenever a processor of the IC device is running; and
sensor circuitry configured to measure the oscillation frequency,
wherein a decrease in the measured oscillation frequency as the IC device ages indicates degradation of components in the IC device,
wherein the ring oscillator circuitry comprises a set of ring oscillators including the ring oscillator,
wherein the ring oscillators in the set of ring oscillators are fabricated to operate at different threshold voltages corresponding to threshold voltages of different portions of circuitry in the IC device, and
wherein the measured oscillation frequency is output to external circuitry configured to determine changes in the oscillation frequency over time.

2. The IC device of claim 1, wherein the set of ring oscillators includes a ring oscillator having an odd-numbered combination of NAND gates, NOR gates, and inverter gates.

3. A non-transitory computer readable medium having stored therein instructions that, when executed by an integrated circuit (IC) device, cause the IC device to execute operations including:
generating, by an oscillator circuit, an oscillation frequency equal to a switching frequency of the IC device whenever a processor of the IC device is running;
measuring, by sensor circuitry, the oscillation frequency;
comparing the measured oscillation frequency to a threshold value; and
in response to determining that a decrease in the measured oscillation frequency exceeds the threshold value, determining that the IC device has reduced functionality,
wherein the decrease in the measured oscillation frequency as the IC device ages indicates degradation of components in the IC device.

4. The non-transitory computer readable medium of claim 3, wherein the switching frequency of the IC device is equal to a switching frequency of a processor of the IC device.

5. The non-transitory computer readable medium of claim 3, wherein the switching frequency of the IC device is a sub-multiple of a clock frequency of the IC device.

6. The non-transitory computer readable medium of claim 3, wherein the switching frequency of the IC device is a switching frequency of a specified circuit in the IC device.

7. The non-transitory computer readable medium of claim 3, wherein the oscillator circuit comprises multiple oscillator circuits, individual ones of the multiple oscillator circuits corresponding to specified portions of circuitry of the IC device, and
the instructions further comprise instructions for causing the individual ones of the multiple oscillator circuits to be activated when the corresponding portions of the circuitry of the IC device are activated,
wherein each of individual ones of the multiple oscillator circuits operates at a same switching frequency as the corresponding portions of the circuitry of the IC device.

8. The non-transitory computer readable medium of claim 3, further comprising instructions for causing the oscillator circuit to generate the oscillation frequency when a specified circuit of the IC device is activated.

9. The non-transitory computer readable medium of claim 3, further comprising instructions for outputting the measured oscillation frequency to external circuitry, wherein the external circuitry is configured to determine changes in the oscillation frequency over time.

10. A method, comprising:
operating digital ring oscillator (DRO) circuitry to oscillate at a frequency related to an switching frequency of an integrated circuit (IC) device;
measuring the oscillation frequency;
outputting the measured oscillation frequency;
receiving, at a measurement device configured to communicate with the IC device, the measured oscillation frequency; and
determining, by the measurement device, a difference in the measured oscillation frequency received at a first time and a second time, wherein a decrease in the measured oscillation frequency as the IC device ages indicates degradation of components in the IC device.

11. The method of claim 10, further comprising:
comparing, by the measurement device, the measured oscillation frequency to a threshold value,
wherein a decrease in the measured oscillation frequency over time exceeding the threshold value indicates that the IC device has reduced functionality.

12. The method of claim 10, wherein operating the DRO circuitry comprises operating a set of DROs.

13. The method of claim 12, wherein the set of DROs includes a ring oscillator having an odd-numbered combination of NAND gates, NOR gates, and inverter gates.

14. The method of claim 10, further comprising:
receiving, by control circuitry of the IC device, an instruction for causing the DRO circuitry to generate the oscillation frequency.

15. The method of claim 10, further comprising:
generating, by the DRO, the oscillation frequency when a processor of the IC device is running.

16. The method of claim 10, wherein the oscillation frequency is equal to the switching frequency of the integrated circuit device.

* * * * *